United States Patent
Chang (10) Patent No.: US 11,754,653 B1
(45) Date of Patent: Sep. 12, 2023

(54) METHODS FOR ACCELERATED ECHO PLANAR IMAGING WITH FLEET AUTOCALIBRATION SCANS

(71) Applicant: Siemens Healthcare GmbH, Erlangen (DE)

(72) Inventor: Yulin Chang, Belmont, MA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/807,482

(22) Filed: Jun. 17, 2022

(51) Int. Cl.
*G01R 33/561* (2006.01)
*G01R 33/56* (2006.01)
*G01R 33/483* (2006.01)

(52) U.S. Cl.
CPC ..... *G01R 33/5616* (2013.01); *G01R 33/4835* (2013.01); *G01R 33/5608* (2013.01); *G01R 33/5611* (2013.01)

(58) Field of Classification Search
None
See application file for complete search history.

(56) References Cited

U.S. PATENT DOCUMENTS

| | | | | |
|---|---|---|---|---|
| 8,384,385 B2* | 2/2013 | Gross | ............. | G01R 33/565 324/309 |
| 10,228,434 B2 | 3/2019 | Polimeni et al. | | |
| 2015/0247910 A1* | 9/2015 | Riederer | ............. | G01R 33/5619 324/309 |
| 2019/0235037 A1* | 8/2019 | Nagashima | ............. | G01R 33/385 |

OTHER PUBLICATIONS

Polimeni, Jonathan R., et al. "Reducing sensitivity losses due to respiration and motion in accelerated echo planar imaging by reordering the autocalibration data acquisition." Magnetic resonance in medicine 75.2 (2016): 665-679.

* cited by examiner

*Primary Examiner* — Rodney E Fuller

(57) ABSTRACT

Systems and methods for improving calibration of MRI imaging using echo-planar imaging (EPI) include a multi-shot radio frequency (RF) excitation during a calibration phase and a processor that calibrates the k-space for a slice by acquiring k-space data through multi-shot EPI data acquisition for a plurality of interleaved segments in the slice, each divided into a predetermined number of readout lines. Each EPI data acquisition includes providing a series of frequency encoding pulses throughout a readout period equal to the predetermined number of readout lines, providing a series of phase encoding pulses during a middle portion of the readout period corresponding to a middle section of the k-space, capturing magnetic resonance signals during the middle portion. The frequency and phase encoding pulse each include a rewinder pulse before a spoiler pulse after the magnetic resonance signals are captured. The processor creates a calibration model from the acquired k-space data based on the magnetic resonance signals during the middle portion, wherein k-space data corresponding to each segment in the slice is acquired before acquiring data for subsequent slices.

10 Claims, 8 Drawing Sheets

Segment A

Segment B

METHODS FOR ACCELERATED ECHO PLANAR IMAGING WITH FLEET AUTOCALIBRATION SCANS

BACKGROUND

Echo-planar imaging (EPI) is a commonly used pulse sequence method for rapid magnetic resonance imaging (MRI), especially for functional, diffusion and perfusion MRI. EPI is performed using a pulse sequence in which multiple echoes of different phase steps are acquired using rephasing gradients instead of repeated 180-degree radiofrequency pulses following the 90°/180° in a spin echo sequence. This is accomplished by rapidly reversing the readout or frequency-encoding gradient. In a single-shot echo-planar sequence, the entire range of phase encoding steps (often up to 128) are acquired in one TR. In multi-shot echo-planar imaging, the range of phase steps is equally divided into several "shots" or TR periods. For example, an image with 256 phase steps could be divided into 4 shots of 64 steps each. These are often interleaved, EPI is vulnerable to intrinsic image artifacts such as geometric distortion and blurring. Single-shot EPI with slice-priority multi-shot parallel imaging auto-calibration scans (ACS) suffer from elevated physiological noise in the presence of breathing and other physio-motion of the subject. Fast low-angle excitation echo planar technique (FLEET) ACS was invented to address the physiological noise issue for in vivo scans by using segment-prioritized multi-shot ACS and low flip angle to speed up the ACS acquisition. However, EPI with FLEET ACS suffers from lower signal-to-noise ratio (SNR) for the ACS which could lead to lower image quality compared to the conventional EPI using slice-prioritized multi-shot-EPI ACS for parallel imaging.

Since EPI with FLEET ACS reduced physiological noise and consequently the temporal SNR (tSNR), its trade-off of image quality has not been fully addressed previously.

SUMMARY

The present disclosure generally relates to laboratory automation systems and clinical chemistry analyzer systems for use in a laboratory environment. In particular, the present disclosure is generally directed to track configurations for analyzer systems that are configured to remove or mitigate the effects of liquid contaminants on the track.

In one embodiment, the present disclosure is directed to a method for MRI including steps during a calibration phase of providing a multi-shot radio frequency (RF) excitation to an RF coil that excites spins in a slice of patient tissue and comprises a plurality of different RF excitation pulses each having a predetermined flip angle for each shot and calibrating a k-space for the slice by acquiring k-space data corresponding to the slice through multi-shot EPI data acquisition for a plurality of interleaved segments in the slice, each interleaved segment divided into a predetermined number of readout lines. Each EPI data acquisition is accomplished by providing a series of frequency encoding pulses equal to the predetermined number of readout lines throughout a readout period, providing a series of phase encoding pulses during a middle portion of the readout period corresponding to a middle section of the k-space, and capturing magnetic resonance signals during the middle portion, wherein the frequency and phase encoding pulse each include a rewinder pulse before a spoiler pulse after the magnetic resonance signals are captured. The method continues by creating a calibration model from the acquired k-space data based on the magnetic resonance signals during the middle portion. K-space data corresponding to each segment in the slice is acquired before acquiring data for subsequent slices.

According to one aspect, the predetermined flip angle is at least 50% of a target flip angle used during subsequent imaging. According to another aspect, each phase encoding rewinder pulse is the same magnitude and opposite polarity as an integral of the preceding phase encoding pulses. According to another aspect, each frequency encoding rewinder pulse is the same magnitude and opposite polarity as an integral of the preceding frequency encoding pulses. In some embodiments, the method continues by imaging the slice of patient tissue after calibration phase, wherein imaging includes providing a predetermined number of imaging readout lines and the number of readout lines during the calibrating step that is the same as the number of imaging readout lines.

In one embodiment, the present disclosure is directed to a method for MRI including at least one RF coil configured to transmit a multi-shot RF excitation to an RF coil that excites spins in a slice of patient tissue and comprises a plurality of different RF excitation pulses each having a predetermined flip angle for each shot and a processor configured to calibrate a k-space for the slice by acquiring k-space data corresponding to the slice through multi-shot echo planar imaging (EPI) data acquisition for a plurality of interleaved segments in the slice, each interleaved segment divided into a predetermined number of readout lines. Each EPI data acquisition is accomplished by providing a series of frequency encoding pulses equal to the predetermined number of readout lines throughout a readout period, providing a series of phase encoding pulses during a middle portion of the readout period corresponding to a middle section of the k-space, and capturing magnetic resonance signals during the middle portion, wherein the frequency and phase encoding pulse each include a rewinder pulse before a spoiler pulse after the magnetic resonance signals are captured. The processor continues by creating a calibration model from the acquired k-space data based on the magnetic resonance signals during the middle portion. K-space data corresponding to each segment in the slice is acquired before acquiring data for subsequent slices.

FIGURES

The accompanying drawings, which are incorporated in and form a part of the specification, illustrate the embodiments of the invention and together with the written description serve to explain the principles, characteristics, and features of the invention. In the drawings.

DESCRIPTION

This disclosure is not limited to the particular systems, devices and methods described, as these may vary. The terminology used in the description is for the purpose of describing the particular versions or embodiments only and is not intended to limit the scope.

As used herein, the terms "algorithm," "system," "module," "engine," or "architecture," if used herein, are not intended to be limiting of any particular implementation for accomplishing and/or performing the actions, steps, processes, etc., attributable to and/or performed thereby. An algorithm, system, module, engine, and/or architecture may be, but is not limited to, software, hardware and/or firmware or any combination thereof that performs the specified functions including, but not limited to, any use of a general and/or specialized processor in combination with appropriate software loaded or stored in a machine-readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, engine, and/or architecture may be equally performed by multiple algorithms, systems, modules, engines, and/or architectures incorporated into and/or combined with the functionality of another algorithm, system, module, engine, and/or architecture of the same or different type, or distributed across one or more algorithms, systems, modules, engines, and/or architectures of various configurations.

Embodiments improve image quality over existing FLEET ACS methods using several possible features. Some embodiments use a combination of matching the echo train length of the FLEET ACS with the echo train of the imaging scans and applying a proper rewinding of the 0th gradient moment before the gradient spoilers for the FLEET ACS. For EPI with parallel imaging, the external reference scans are often shorter than the imaging scans. Thus, it is possible to use shorter echo trains for the reference scans. However, for considerations like eddy currents, it is often helpful to use echo trains as long as in the imaging scans. To keep the reference data smaller, "blind" readout (applying encoding without capturing image readout data) is used at the beginning and the end of the echo train. Additionally, since FLEET ACS are acquired with segments as the inner loop, a proper rewinder of the gradient moment can help improve the image quality. Applying a rewinder gradient at end of phase-encoding gradient blips ensures that the total 0th gradient moment returns to zero before the spoiler gradient turns on, leading to more repeatable ACS images.

Figure 1:
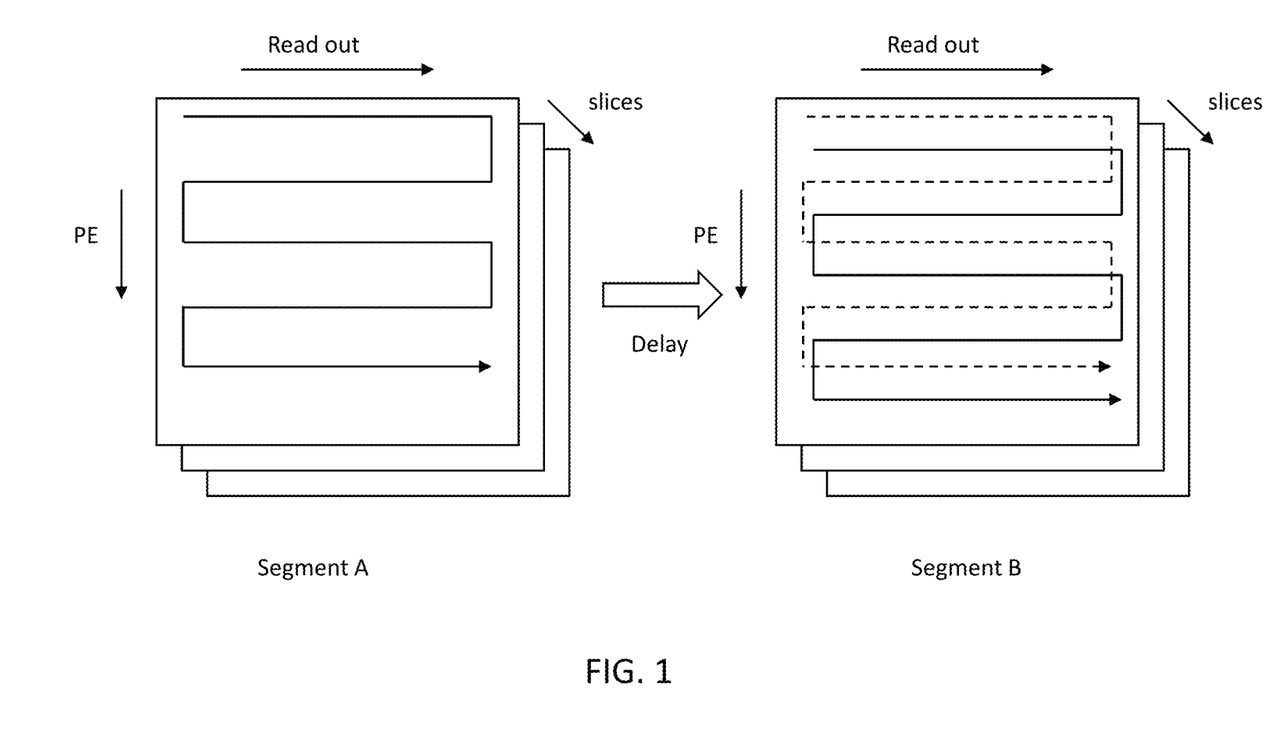
FIG. 1 is a scan diagram of different scanning techniques.

FIG. 1 shows an exemplary difference between conventional multi-shot EPI imaging and FLEET, as they would be used for ACS. With both techniques, the k-space is rasterized with phase encoding (PE) and a frequency encoding in the readout direction. The space is divided into multiple interleaved segments (only two are shown in FIG. 1, but any reasonable number can be used) in the phase encoding direction to minimize the capture time for each image segment to minimize artifacts. In conventional ACS imaging, the first segment in each slice is captured before proceeding to the next segment. This means that the delay between each segment is at least the readout time (TR) of each segment times the number of slices. Thus, the conventional time-ordering of the segments in a multi-shot EPI-based ACS acquisition maximizes the time interval between the acquisitions of the segments in each slice. This allows for magnetic recovery that allows a 90-degree flip angle for higher contrast. However, this delay can lead to motion artifacts, offsetting the benefits of higher contrast. FLEET, on the other hand, provides a means of consecutive-segment multi-shot EPI-based ACS acquisition that reduces motion and respiratory-cycle effects on the time-series data. The benefit of FLEET for multi-shot EPI is reduced acquisition time for a given slice, often on the same order as single-shot EPI. The effective echo-spacing of the FLEET ACS provides an accelerated readout without suffering from secondary generalized auto-calibrating partially parallel acquisitions (GRAPPA) artifacts—which are expected for other fast ACS approaches such as FLASH ACS. However, because the target tissue is not fully recovered, the flip angle cannot be a full 90 degrees. Typically, the flip angle used in FLEET is no more than 20 degrees. Additional details on exemplary prior art FLEET ACS techniques can be found in "Reducing Sensitivity Losses Due to Respiration and Motion in Accelerated Echo Planar Imaging by Reordering the Autocalibration Data Acquisition," Polimeni, et al., Magn Reson Med, 2016; 75:665-679.

Figure 2:
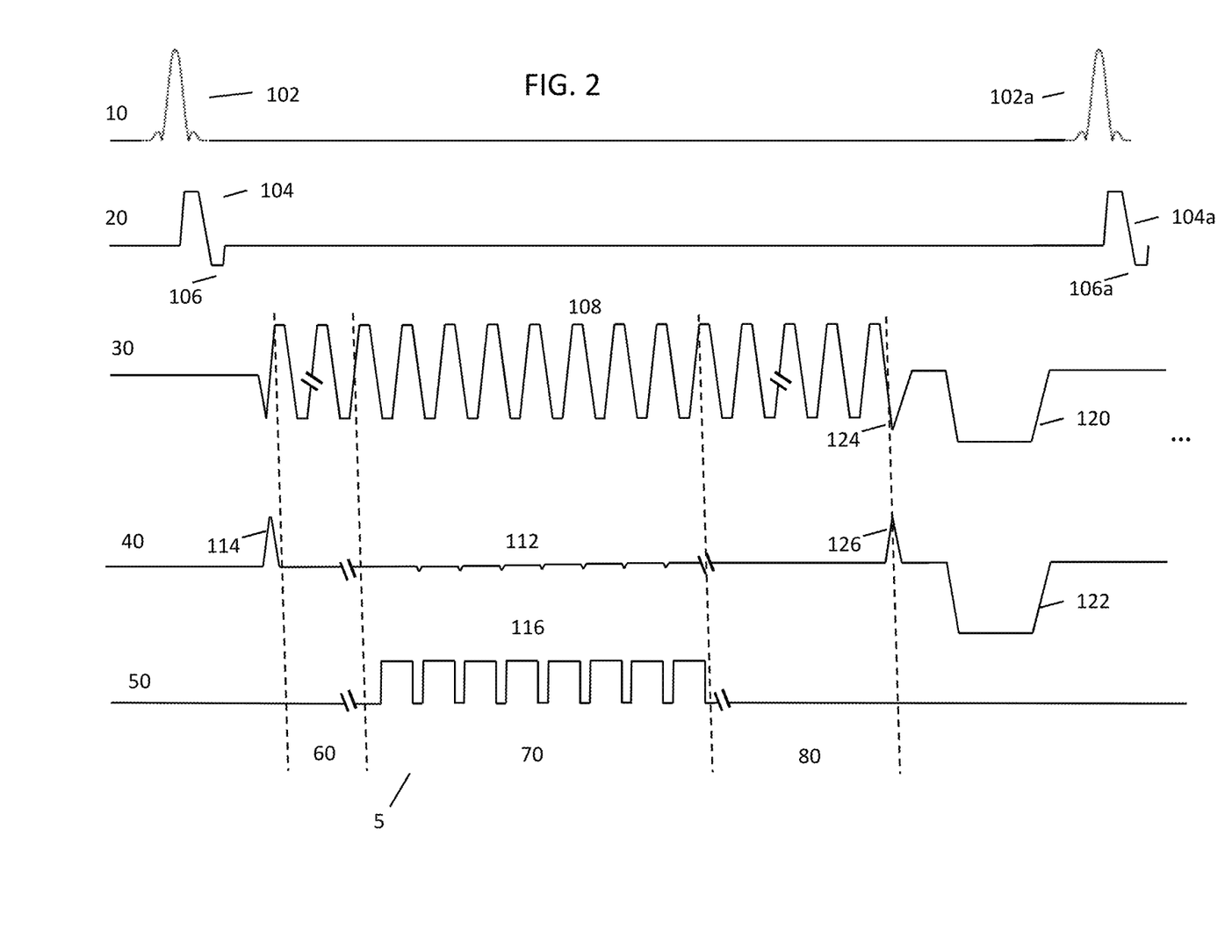
FIG. 2 is a timing diagram of a method for modified FLEET ACS in accordance with some embodiments.

FIG. 2 shows a timing diagram for exemplary modified FLEET ACS technique employed by embodiments. Like conventional FLEET, this embodiment of an imaging technique uses RF excitation pulses designed to set the EPI echo angle according to the methods described in the present disclosure as illustrated. In this example, two EPI segments, (two shots), are illustrated. It should be noted that these methods can also be implemented with the respective pulse sequences for any suitable number of shots. Exemplary EPI shot 5 shows the signals used for a single EPI shot of a FLEET ACS segment. The RF excitation pulses 10 and associated slice-select gradient pulses 20 are followed by acquisition. Each shot in the sequence begins with an RF excitation pulse 102 in the presence of a slice-select gradient 104. An exemplary RF excitation pulse 102 is a DIST RF pulse, the properties of which set the echo angle. The RF excitation pulse part of a multi-shot RF excitation applied to an RF coil of an MRI machine that excites spins in the slice, each of the RF pulse is timed and sized to introduce a flip angle and can be said to have a predetermined flip angle.

In some embodiments, the slice-select gradient 104 can include a slice-selection rephasing gradient 106 to minimize phase dispersions introduced by the slice-select gradient 104. In some embodiments, the RF excitation pulse 102a, the slice-select gradient 104a, and rephasing lobe 106a for subsequent shots can be the same or can differ from 102, 104, and 106, respectively, between shots.

Following excitation of the nuclear spins in the imaging slice, data within a given segment are acquired by sampling a series of echo signals in the presence of an alternating readout gradient 30. Alternating frequency-encoding readout gradient pulses 108 scan the sampling point along the frequency-encoding direction, or readout, in k-space. Spatial encoding of the echo signals along a normal phase-encoding direction can be performed by phase encoding signal 40, which includes a series of phase-encoding gradient blips 112. These occur between the lobes of the alternating readout gradient pulses 108, causing each echo signal to be separately phase encoded.

Because these signals are used for FLEET ACS, there is no need to capture image data across the entire k-space. The most relevant data that contributes the most signal occurs in the middle of the k-space. Thus, many embodiments do not capture data across the entire k-space (or at least use all k-space data for calibration). Because ACS is used to calibrate image collection, in some embodiments, the entire k-space is scanned, but data is only acquired during the portion of the scan near the center of the k-space. This allows the same eddy currents to be present during the calibration scans as would be present in the imaging scans.

Thus, the frequency-encoding readout signal 30 includes the same number of readout pulses 108 as prior art FLEET techniques that capture the entire space. In some embodiments, there are fewer phase-encoding blips 112 than readout pulses 108, allowing the ACS EPI to mimic a full scan without phase encoding the segment until the normal time. To move the scan to the middle section of the k-space, the phase-encoding gradient signal 40 includes a pre-phasing gradient pulse 114 that acts to move the first sampling point along the phase-encoding direction by a predetermined offset distance in k-space corresponding to the start of a targeted middle section of k-space, and in-phase with the respective scan line. In general, the pre-phasing gradient pulse 114 will be different between multiple shots because each interleave acquires a slightly different set of k-space lines in the targeted region. Furthermore, pre-phasing gradient pulse 114 will be smaller than prior art FLEET pulse that scan the entire k-space because pulse 114 need only move the phase to the edge of the targeted portion of k-space.

Figure 3:
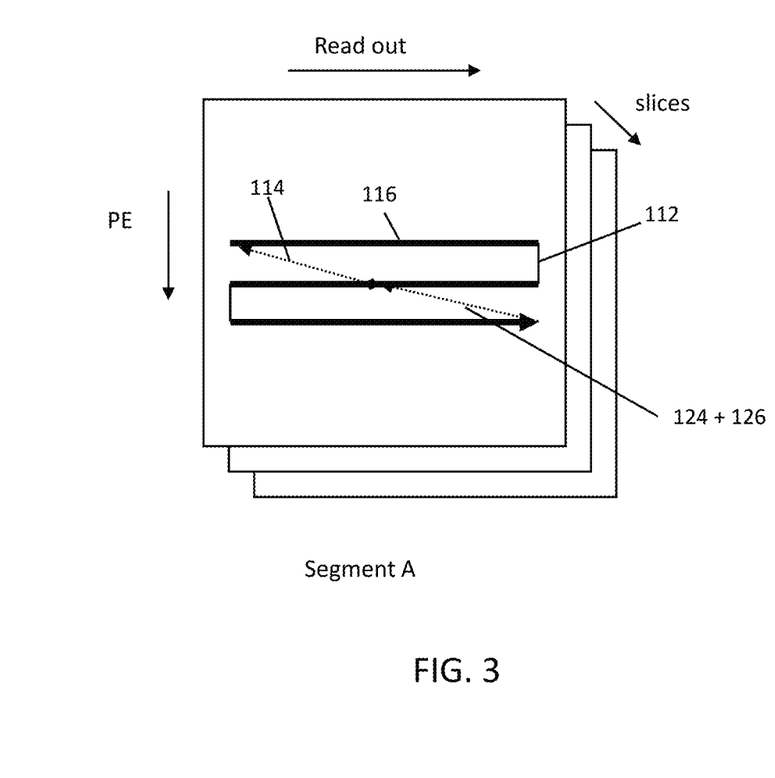
FIG. 3 is a scan diagram of a scan method for use with some embodiments.

Image data is acquired via ADC signal 50, which includes a series of pulses 116 to capture the echo signal. These will generally only occur during the middle section of the sequence, corresponding to the selected middle window of the phase-encoded portion of the k-space. Thus, in contrast to prior art FLEET sequences (such as those in U.S. Pat. No. 10,228,434) the pulse sequence for each RF excitation pulse 102 can be divided into three sections: blind readout periods 60 and 80, corresponding to the upper and lower portions of the phase-encoded k-space and active readout portion 70, during which both phase encoding and ADC capture are active, which corresponds to a predetermined middle portion of the phase-encoded k-space. In some embodiments, this predetermined middle portion (corresponding to section 70) is the middle third of the k-space and the blind readout portions (corresponding to sections 60 and 80) are the upper and lower third of the k-space. Thus, each blind and active readout portion of the scan for a given segment is approximately one-third of time between the RF excitation 102 (e.g., each readout portion is ⅓ of a TR period, minus the amount of time for rewinding and spoiling and any necessary signal hold times). This concept is illustrated in FIG. 3.

In some embodiments the active sections (112 and 116, respectively) phase encoding signal 40 of ADC signal 50 can extend into periods 60 and 80 or be quiescent, as they do not have a substantial impact on eddy currents in the slice. If data is captured during the entire k-space, only the data collected during selected middle portion 70 is used for calibration.

At the end of each pulse sequence for a given RF excitation angle, a spoiler signal is applied to dephase the slice. For example, spoiler signals 120 and 122 dephase the frequency-encoded and phase-encoded space, respectively. However, because of the selective nature with respect to the k-space in the signals shown in FIG. 2, it can be helpful for image consistency to apply a rewind pulse to the frequency-encoded and phase-encoded spaces before the spoiler. These rewind pulses return the phase and frequency encoding to the center of the k-space before the large spoiler signal. This ensures that the encoding is zeroed out consistently before the next RF excitation. Rewind pulses 124 and 126 in the frequency-encoded (readout) and phase-encoded domains should have an area equal in size and opposite in polarity to the net integral of signals (30 and 40, respectively) to return the encoding to the center of the k-space.

This pulse sequence for a given segment repeats a plurality of times to acquire the full set of k-space data for a given slice. In subsequent repetitions of the pulse sequence, the flip angle of the RF excitation pulse 102 can be the same or varied. Once each segment of k-space data is acquired, an image can be reconstructed from the k-space data using conventional techniques. For example, reconstructing two-dimensional or three-dimensional images can be done by performing a Fourier transformation of raw k-space data, performing other image reconstruction algorithms (e.g., iterative reconstruction algorithms), applying filters to raw k-space data or to reconstructed images, generating functional magnetic resonance images, or calculating motion or flow images, or the like.

FIG. 3 shows how k-space is traversed within a single slice segment using the blind readout approach of FIG. 2. In contrast to the scan sequence illustrated in FIG. 1, where each segment is an interleaved portion of the entire k-space, the phase encoding and capture need only be adjusted during the middle portion of the scan for a given interleaved segment in this example. Meanwhile, the readout signal proceeds as normal to induce the same eddy currents during calibration that would be expected during normal imaging. However, in this example, the phase encoding signal does not change until the time period normally corresponding to the middle of k-space, and the horizontal blind scan lines are not shown. When the normal time to scan the middle portion of the k-space happens, phase encoding is applied, and the ADC captures data (shown as bold scan lines). Thus, the overall scan time is not changed compared to conventional FLEET techniques. However, there is a larger amount of time between rows that are actually captured by the ADC signal.

In this example, three phases are scanned in segment A (subsequent segments not shown). Dotted lines show the effect on k-space indexing of pulses 114 (and the corresponding start of the first pulse in pulses 116) to a start location (these may be referred to as pre-winder pulses) for the scans and the effect of rewind pulses 124 and 126 to return to the center of the k-space before the spoiler pulses.

Figure 4:
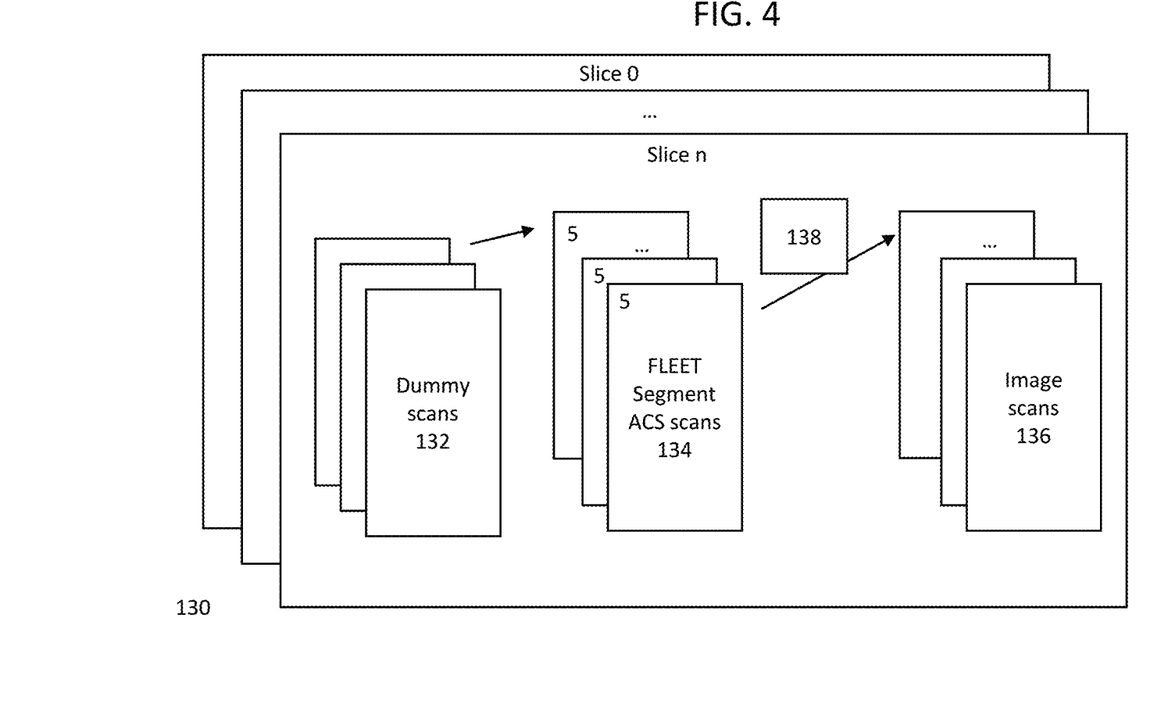
FIG. 4 is a diagram of a method for modified FLEET ACS in accordance with some embodiments.

FIG. 4 provides a holistic view of how the signals of EPI shot 5 from FIG. 2 fall into an imaging scheme 130 that uses FLEET ACS. For each patient slice (0-n) to be imaged, a series of dummy scans 132 are used to prepare the patient slice to accept larger RF flip angles. Each dummy scan uses essentially the same signals as EPI shot 5, except no data is collected. Three dummy scans 132 are used in an exemplary embodiment. After the dummy scans, the slice is divided into two or more segments 134, each being scanned using the EPI shot signals 2 shown in FIG. 2. These segments are interleaved, and in some embodiments, only the central region of the k-space is scanned. Once all interleaved segments of the slice are scanned for calibration data, a calibration model 138 of the k-space is created using known calibration techniques. Then, a series of conventional image scans 136 are taken of the slice, using the calibration model 138. The model improves the imaging by adjusting the data in the k-space/image transform.

Another feature of the modified FLEET ACS technique shown is that a higher flip angle should be used than conventional FLEET. Whereas conventional FLEET uses a flip angle that is no more than around 20 degrees, testing of this above-described technique shows that better contrast in the calibration image (and therefore better calibration) can be had without sacrificing protection against motion/blur artifacts if a flip angle of 50% or more than the flip angle that will be used during the post-calibration imaging steps is used. For example, when using conventional 90-degree imaging, a 45-degree flip angle during the calibration phase better calibrates the image space than 15 degrees. (See FIG. 5B)

Figure 5A:
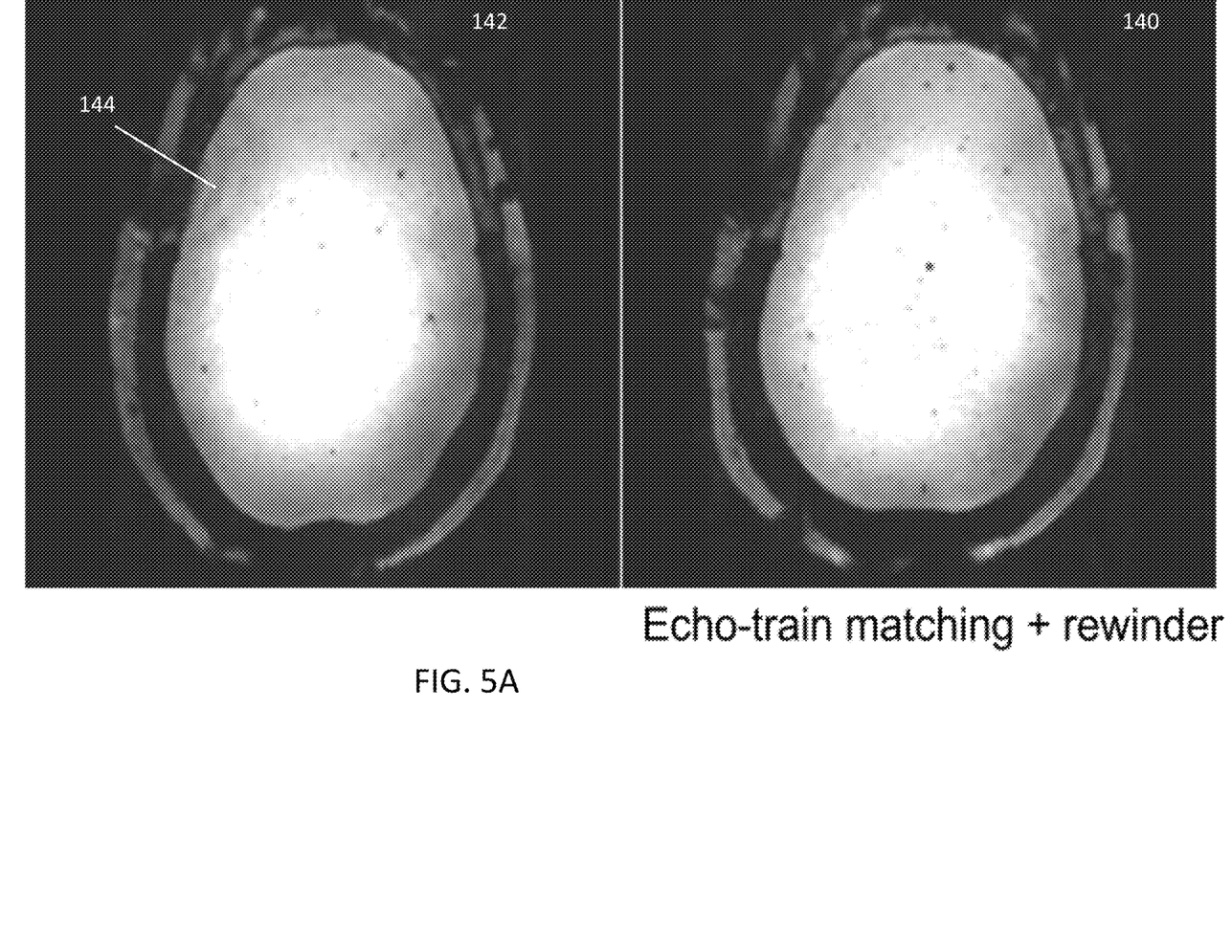
FIGS. 5A and 5B are calibrated image comparisons of different imaging techniques.

FIG. 5A shows the resulting calibrated images with (140) and without (142) the use of a rewinder signal. Notice the radiating artifact 144 in image 142 when no rewinder signal is used during the calibration sequence (e.g., 124 and 126 are not used).

Figure 5B:
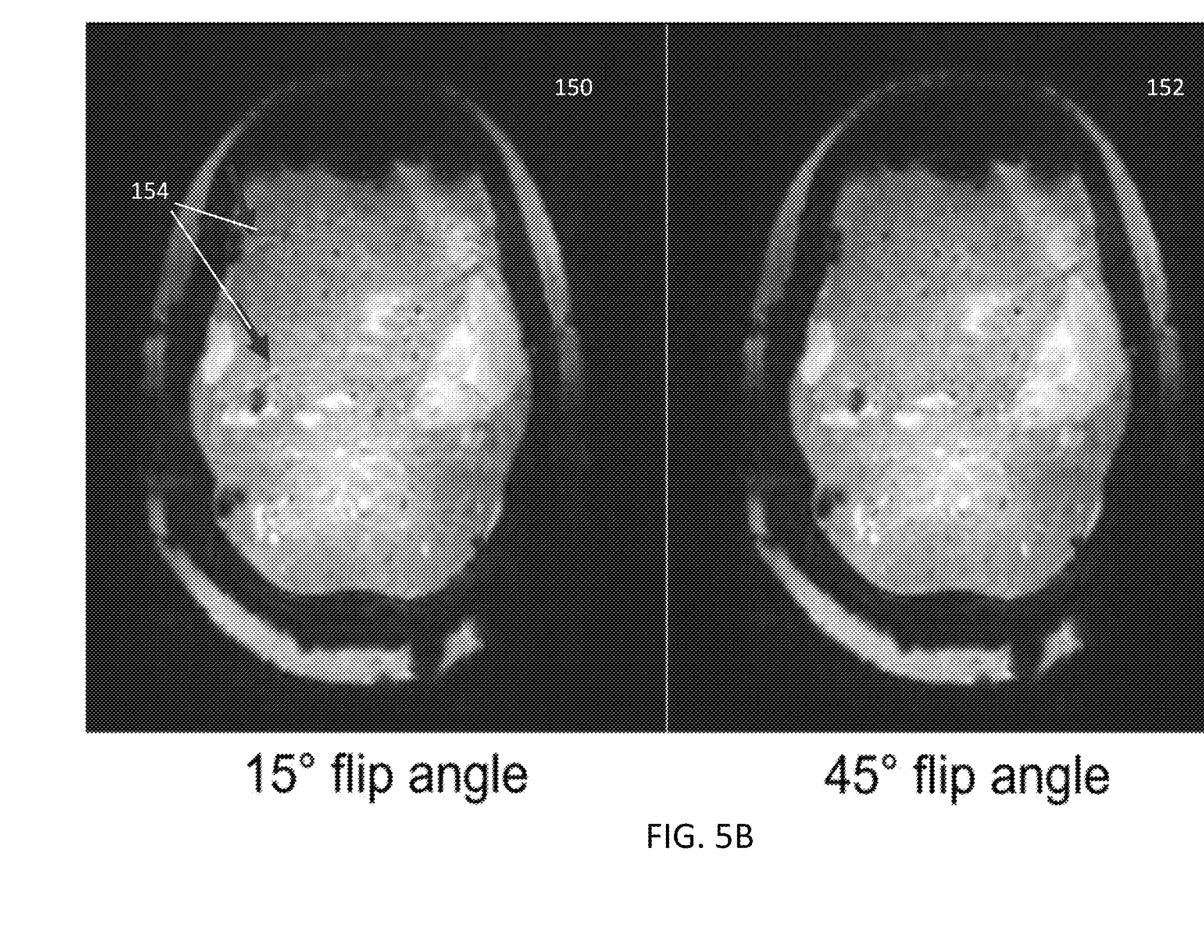

FIG. 5 shows the resulting calibrated images when the flip angle of the RF excitation pulse 102 is 15 degrees (150) and 45 degrees (152). Note that there are wrap around or ghosting artifact lines 154 when the lower flip angle is used.

Thus, a higher flip angle and a rewinder pulse can improve calibration over prior art FLEET ACS using the signals of FIG. 2, without substantially changing the overall calibration time. In some embodiments, the systems and techniques described above can be implemented in or by a medical imaging system, such as the medical imaging system 800 illustrated in FIGS. 6A and 6B.

Figure 6A:
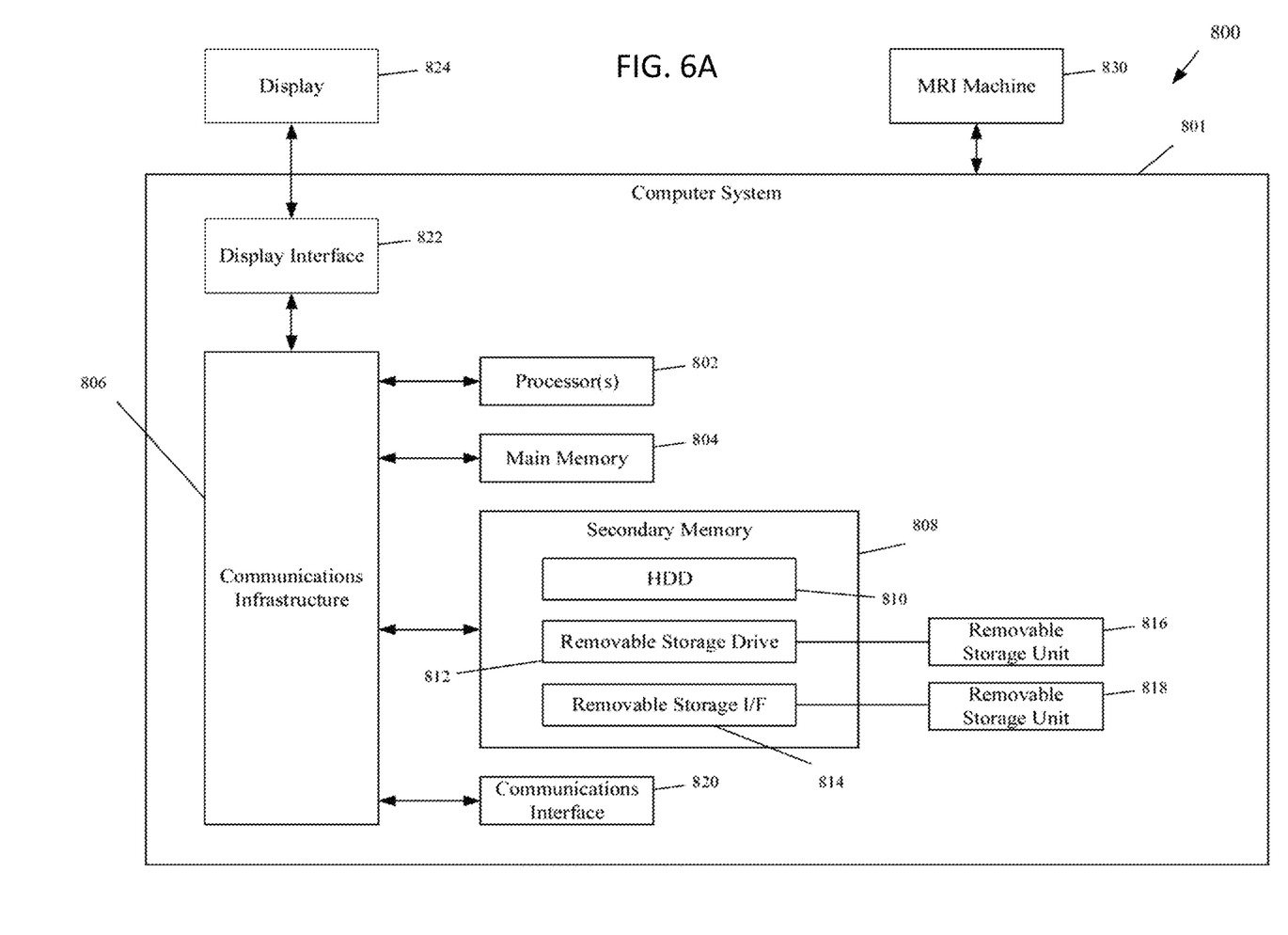
FIGS. 6A and 6B are system diagrams of exemplary computing and MRI imaging systems for use with some embodiments.

FIG. 6A is an architecture diagram of medical imaging system 800 that may be used in some embodiments. As noted above, the medical imaging system 800 can include a computer system 801 and an imaging machine 830 (e.g., an MRI machine). The computer system 801 may include one or more processors 802. Each processor 802 is connected to a communication infrastructure 806 (e.g., a communications bus, cross-over bar, or network). The processor(s) 802 can include a CPU, a GPU, an AI accelerator, and/or a variety of other processor types. Computer system 801 may include a display interface 822 that forwards graphics, text, and other data from the communication infrastructure 806 (or from a frame buffer, not shown) for display on the display unit 824.

Computer system 801 may also include a main memory 804, such as a random-access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 801. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 801.

Computer system 801 may also include a communications interface 820. Communications interface 820 allows software and data to be transferred between computer system 801 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 801. Computer programs (also referred to as computer control logic) may be stored in main memory 804 and/or secondary memory 808. Computer programs may also be received via communications interface 820. Such computer programs, when executed by a processor, enable the computer system 801 to perform the features of the methods discussed herein. For example, main memory 804, secondary memory 808, or removable storage units 816 or 818 may be encoded with computer program code (instructions) for performing operations corresponding to various processes disclosed herein.

Figure 6B:
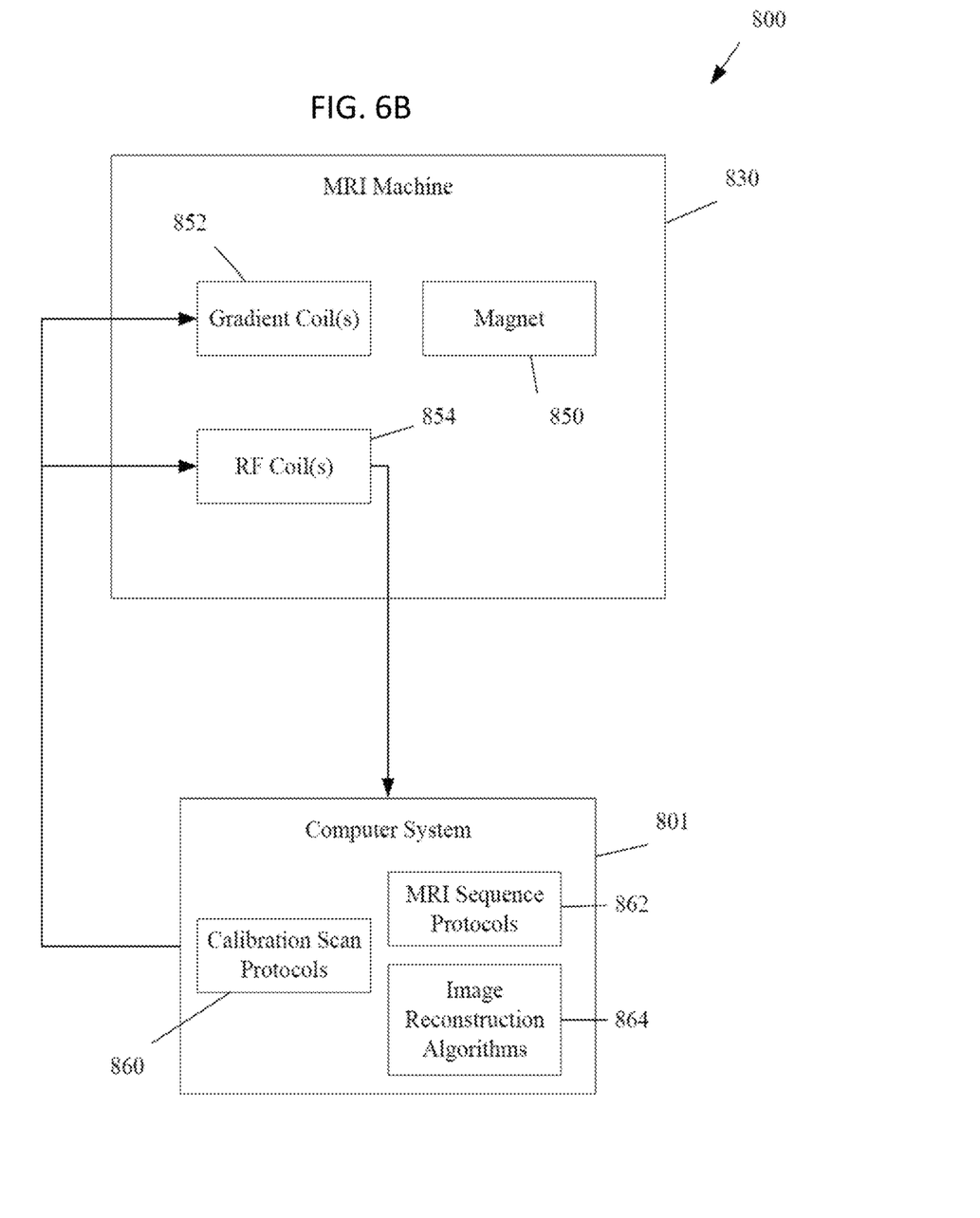

Referring now to FIG. 6B, an exemplary MRI machine 830 can include a magnet 850 (e.g., extending along a bore) that is configured to receive a patient therein and that is configured to produce a generally uniform magnetic field, one or more gradient coils 852 that are configured to produce magnetic field gradients (e.g., linear gradients), and one or more RF coils 854 that are configured to transmit to RF signals to the patient's body and/or receive RF signals therefrom. The computer system 801 (embodiments of which are described in greater detail above) can store and implement calibration scan protocols 860, MRI sequences protocols 862, and/or image reconstruction algorithms 864, as well as a variety of other software modules known in the technical field. The MRI sequence protocols 862 can be embodied as instructions that, when executed by the computer system 801, cause the computer system 801 to control the gradient coils 852 and/or RF coils 854 to apply a particular sequence of magnetic field gradients and/or RF pulses to the patient. The image reconstruction algorithms 864 can be embodied as instructions that, when executed by the computer system 801, cause the computer system 801 to reconstruct an image of the patient based on the RF signal received from the patient (e.g., by the RF coils 854) as caused by the MRI sequence applied thereto. The image reconstruction algorithms 864 could include the processes 100, 200 or any of the other techniques described above. The calibration scan protocols 860 can likewise be embodied as instructions that, when executed by the computer system 801, cause the computer system 801 to apply particular MRI sequences and/or imaging trajectories (e.g., Cartesian or non-Cartesian trajectories) to calibrate the MRI machine 830 for imaging acquisition and/or parameter mapping applications.

The wearable multicoil shim array devices (such as devices 10 and 20) discussed above are part of RF coils 854 in this system.

It is understood by those familiar with the art that the system described herein may be implemented in hardware, firmware, or software encoded (e.g., as instructions executable by a processor) on a non-transitory computer-readable storage medium.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A method for magnetic resonant imaging (MRI) comprising:
    providing, during a calibration phase, a multi-shot radio frequency (RF) excitation to an RF coil that excites spins in a slice of patient tissue and comprises a plurality of different RF excitation pulses each having a predetermined flip angle for each shot;
    calibrating a k-space for the slice by acquiring k-space data corresponding to the slice through multi-shot echo planar imaging (EPI) data acquisition for a plurality of interleaved segments in the slice, each interleaved segment divided into a predetermined number of readout lines, each EPI data acquisition comprising:
        providing a series of frequency encoding pulses throughout a readout period, equal to the predetermined number of readout lines,
        providing a series of phase encoding pulses during a middle portion of the readout period, corresponding to a middle section of the k-space,
        capturing magnetic resonance signals during the middle portion, wherein the frequency and phase encoding pulse each include a rewinder pulse before a spoiler pulse after the magnetic resonance signals are captured; and
    creating a calibration model from the acquired k-space data based on the magnetic resonance signals during the middle portion,
    wherein k-space data corresponding to each segment in the slice is acquired before acquiring data for subsequent slices.

2. The method of claim 1, wherein the predetermined flip angle is at least 50% of a target flip angle used during subsequent imaging.

3. The method of claim 1, wherein each phase encoding rewinder pulse is the same magnitude and opposite polarity as an integral of the preceding phase encoding pulses.

4. The method of claim 1, wherein each frequency encoding rewinder pulse is the same magnitude and opposite polarity as an integral of the preceding frequency encoding pulses.

5. The method of claim 1, further comprising:
    imaging the slice of patient tissue after calibration phase, wherein imaging includes providing a predetermined number of imaging readout lines and the number of readout lines during the calibrating step that is the same as the number of imaging readout lines.

6. A system for magnetic resonant imaging (MRI), comprising:
    at least one RF coil configured to transmit a multi-shot radio frequency (RF) excitation to an RF coil that excites spins in a slice of patient tissue and comprises a plurality of different RF excitation pulses each having a predetermined flip angle for each shot; and
    a processor configured to calibrate a k-space for the slice by acquiring k-space data corresponding to the slice through multi-shot echo planar imaging (EPI) data acquisition for a plurality of interleaved segments in the slice, each interleaved segment divided into a predetermined number of readout lines, each EPI data acquisition comprising:
        providing a series of frequency encoding pulses throughout a readout period, equal to the predetermined number of readout lines,
        providing a series of phase encoding pulses during a middle portion of the readout period, corresponding to a middle section of the k-space,
        capturing magnetic resonance signals during the middle portion, wherein the frequency and phase encoding pulse each include a rewinder pulse before a spoiler pulse after the magnetic resonance signals are captured, and
        creating a calibration model from the acquired k-space data based on the magnetic resonance signals during the middle portion, wherein k-space data corresponding to each segment in the slice is acquired before acquiring data for subsequent slices.

7. The system of claim 6, wherein the predetermined flip angle is at least 50% of a target flip angle used during subsequent imaging.

8. The system of claim 6, wherein each phase encoding rewinder pulse is the same magnitude and opposite polarity as an integral of the preceding phase encoding pulses.

9. The system of claim 6, wherein each frequency encoding rewinder pulse is the same magnitude and opposite polarity as an integral of the preceding frequency encoding pulses.

10. The system of claim 6, wherein the EPI data acquisition further comprises:
 imaging the slice of patient tissue after calibration phase, wherein imaging includes providing a predetermined number of imaging readout lines and the number of readout lines during the calibrating step that is the same as the number of imaging readout lines.

\* \* \* \* \*